(12) United States Patent
Samarao et al.

(10) Patent No.: US 9,236,522 B2
(45) Date of Patent: Jan. 12, 2016

(54) MEMS INFRARED SENSOR INCLUDING A PLASMONIC LENS

(71) Applicant: Robert Bosch GmbH, Stuttgart (DE)

(72) Inventors: Ashwin K. Samarao, Mountain View, CA (US); Gary O'Brien, Palo Alto, CA (US); Ando Feyh, Palo Alto, CA (US); Fabian Purkl, Palo Alto, CA (US); Gary Yama, Mountain View, CA (US)

(73) Assignee: Robert Bosch GmbH, Stuttgart, DE (US)

( * ) Notice: Subject to any disclaimer, the term of this patent is extended or adjusted under 35 U.S.C. 154(b) by 0 days.

(21) Appl. No.: 14/091,550

(22) Filed: Nov. 27, 2013

(65) Prior Publication Data

US 2014/0151834 A1 Jun. 5, 2014

Related U.S. Application Data

(60) Provisional application No. 61/731,995, filed on Nov. 30, 2012.

(51) Int. Cl.
*H01L 31/0232* (2014.01)
*H01L 31/18* (2006.01)
*G01J 5/04* (2006.01)
*G01J 5/08* (2006.01)
*G01J 5/02* (2006.01)
*G01J 5/10* (2006.01)
*G01J 5/20* (2006.01)

(52) U.S. Cl.
CPC .................. *H01L 31/18* (2013.01); *G01J 5/024* (2013.01); *G01J 5/045* (2013.01); *G01J 5/0815* (2013.01); *G01J 5/0837* (2013.01); *G01J 5/0856* (2013.01); *G01J 5/10* (2013.01); *G01J 5/20* (2013.01)

(58) Field of Classification Search
CPC .......................... H01L 31/02325; H01L 31/18
USPC ................. 257/430, 433, 773, 751, 752, 762, 257/E21.499, E29.324, E31.11, E31.124; 438/50, 64, 69, 98; 250/208.1, 353; 136/256
See application file for complete search history.

(56) References Cited

U.S. PATENT DOCUMENTS

| | | | |
|---|---|---|---|
| 4,351,677 A * | 9/1982 | Mochizuki et al. | 438/545 |
| 2003/0173501 A1 | 9/2003 | Thio et al. | |
| 2004/0140570 A1 | 7/2004 | Higashi et al. | |
| 2007/0138395 A1* | 6/2007 | Lane et al. | 250/353 |

(Continued)

FOREIGN PATENT DOCUMENTS

| | | |
|---|---|---|
| WO | 2005057247 A2 | 6/2005 |
| WO | 2009106316 A2 | 9/2009 |

OTHER PUBLICATIONS

International Search Report and Written Opinion corresponding to PCT Application No. PCT/US2013/072347, mailed Feb. 20, 2014 (12 pages).

*Primary Examiner* — Cuong Q Nguyen
*Assistant Examiner* — Tong-Ho Kim
(74) *Attorney, Agent, or Firm* — Maginot Moore & Beck LLP

(57) ABSTRACT

A method of fabricating a semiconductor device includes forming an absorber on a substrate, and supporting a cap layer over the substrate to define a cavity between the substrate and the cap layer in which the absorber is located. The method further includes forming a lens layer on the cap layer. The lens layer is spaced apart from the cavity and defines a plurality of grooves and an opening located over the absorber.

17 Claims, 10 Drawing Sheets

(56) References Cited

U.S. PATENT DOCUMENTS

2007/0262239 A1* 11/2007 Niigaki et al. ............. 250/208.1
2008/0185521 A1 8/2008 Hollingsworth
2009/0102003 A1* 4/2009 Vogt et al. ..................... 257/433
2009/0263929 A1* 10/2009 Takeda et al. .................. 438/73

* cited by examiner

MEMS INFRARED SENSOR INCLUDING A PLASMONIC LENS

This application claims priority under 35 U.S.C. §119 to U.S. Provisional Application No. 61/731,995, filed on Nov. 30, 2012, the disclosure of which is incorporated herein by reference in its entirety.

FIELD

This disclosure relates generally to semiconductor sensor devices and methods of fabricating such devices.

BACKGROUND

Infrared radiation (IR) sensors are used in a variety of applications to detect infrared radiation and to provide an electrical output that is a measure of the infrared radiation incident thereon. IR sensors typically use either photonic detectors or thermal detectors for detecting the infrared radiation. Photonic detectors detect incident photons by using the energy of the photons to excite charge carriers in a material. The excitation of the material is then detected electronically. Thermal detectors also detect photons. Thermal detectors, however, use the energy of the photons to increase the temperature of a component. By measuring the change in temperature, the intensity of the photons producing the change in temperature can be determined.

Photonic detectors typically have higher sensitivity and faster response times than thermal detectors. However, photonic detectors must be cryogenically cooled in order to minimize thermal interference, thus increasing the cost, complexity, weight, and power consumption of the device. In contrast, thermal detectors operate at room temperature, thus avoiding the cooling required by photonic detector devices. As a result, thermal detector devices can typically have smaller sizes, lower costs, and lower power consumption than photonic detector devices.

One type of infrared thermal detector is a bolometer device. A bolometer device includes an absorber element for absorbing infrared radiation, a transducer element that has an electrical resistance that varies with temperature, and a substrate. In use, infrared radiation incident upon the bolometer device is absorbed by the absorber element, and the heat generated by the absorbed radiation is transferred to the transducer element. As the transducer element heats in response to the absorbed radiation, the electrical resistance of the transducer element changes in a predetermined manner. By detecting changes in the electrical resistance, a measure of the incident infrared radiation can be obtained.

Bolometer devices must first absorb incident infrared radiation to induce a change in temperature. Typically, however, infrared radiation is dispersed on the absorber as well as portions of the bolometer device that are not configured to absorb infrared radiation, such as the substrate. Accordingly, the efficiency of the bolometer device is less than 100% since the absorber is exposed to only a portion of the incident infrared radiation.

It would be desirable to focus the infrared radiation onto the absorber using a focusing device. Known devices for focusing infrared radiation, however, are very expensive and are typically made using germanium. Furthermore, the cost of known focusing devices for infrared radiation typically exceeds the cost of the bolometer by at least an order of magnitude. Accordingly, while known bolometer devices are effective, there is a constant need to increase the efficiency of bolometer devices, simplify the fabrication, and/or to decrease the production cost of such devices.

SUMMARY

According to an exemplary embodiment of the disclosure, a semiconductor device includes a substrate, a cap wafer, an absorber, and a lens layer. The substrate defines an upper surface. The cap wafer is supported by the substrate and includes a cap layer spaced apart from the substrate. The absorber extends from the upper surface and is located between the substrate and the cap layer. The lens layer is supported by the cap layer. The lens layer defines a plurality of grooves and an opening located over the absorber.

According to another exemplary embodiment of the disclosure, a method of fabricating a semiconductor device includes forming an absorber on a substrate, and supporting a cap layer over the substrate to define a cavity between the substrate and the cap layer in which the absorber is located. The method further includes forming a lens layer on the cap layer. The lens layer is spaced apart from the cavity and defines a plurality of grooves and an opening located over the absorber.

BRIEF DESCRIPTION OF THE DRAWINGS

The above-described features and advantages, as well as others, should become more readily apparent to those of ordinary skill in the art by reference to the following detailed description and the accompanying figures in which.

DETAILED DESCRIPTION

Figure 1:
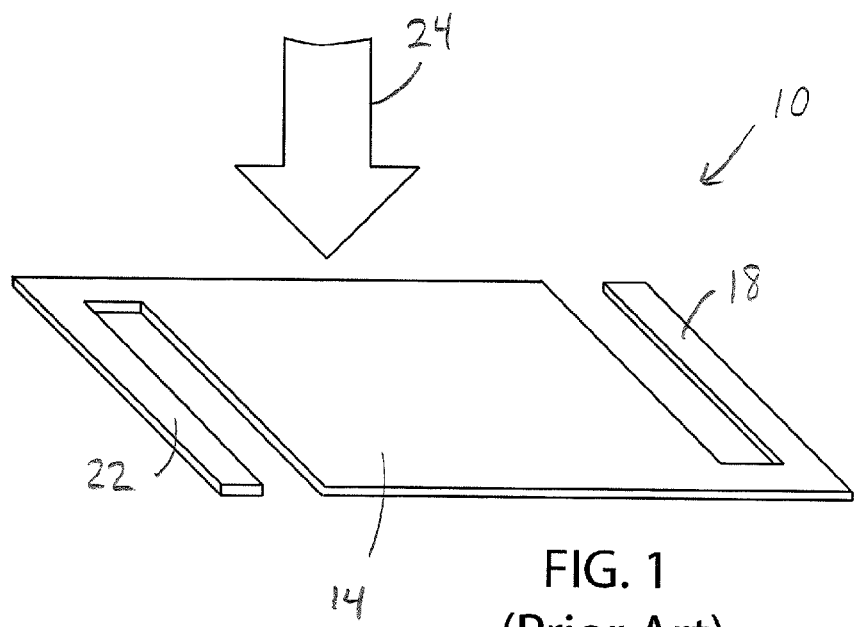
FIG. 1 is a perspective view of a prior art bolometer pixel of a bolometer device.

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

As shown in FIG. 1, a prior art micro electromechanical system (MEMS) bolometer pixel 10 includes an absorber 14 and two legs 18, 22. The absorber 14 is configured to undergo an electrical change in response to absorbing infrared radiation 24 (shown schematically as a downward pointing arrow and also referred to herein as "radiation" and "IR"). When the absorber 14 is exposed to the IR 24 emitted from an object (not shown), the absorber heats up and undergoes, for example, a change in electrical resistance, which is detected using an external electrical circuit (not shown). The exemplary absorber 14 is shown as being a substantially planar rectangular element. In another embodiment, however, the absorber 14 has any desired shape and/or configuration.

The legs 18, 22 extend from the absorber 14 and are configured to be electrically connected to the external electrical circuit that monitors the electrical state of the absorber 14. In one embodiment, the external circuit is configured to generate an output that represents a temperature based on an electrical resistance of the absorber 14, as measured from the leg 18 to the leg 22.

The bolometer pixel 10, including the absorber 14 and the legs 18, 22, is typically formed from an ultra-thin layer (approximately 10 nm), of metal. Exemplary metals include, but are not limited to, vanadium oxide, platinum, and titanium. In another embodiment, the bolometer pixel 10 is formed from any desired material.

Figure 2:
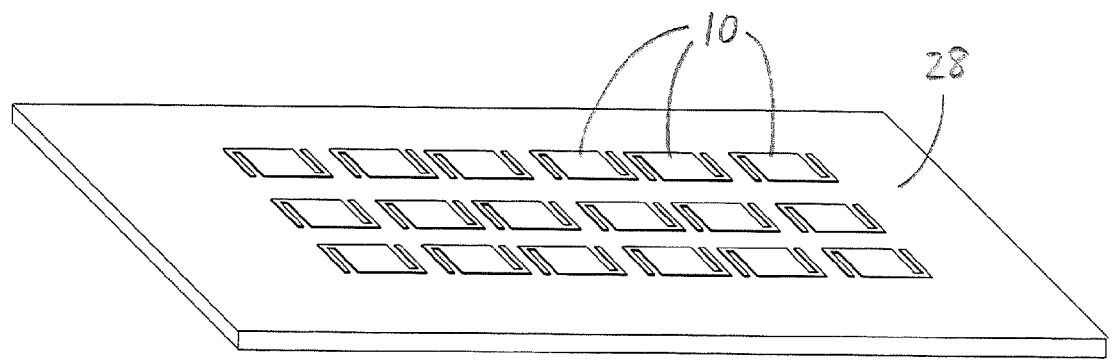
FIG. 2 is a perspective view of a prior art bolometer device including a plurality of the bolometer pixels of FIG. 1 formed on a substrate.

As shown in FIG. 2, a plurality of the bolometer pixels 10 is arranged in a focal plane array on a substrate 28. The substrate 28 is substantially planar and is also referred to herein as a "reflector" and a "reflector layer." The substrate 28 is typically formed from silicon using CMOS technology, but may be formed/made using any desired material and technology.

Figure 3:
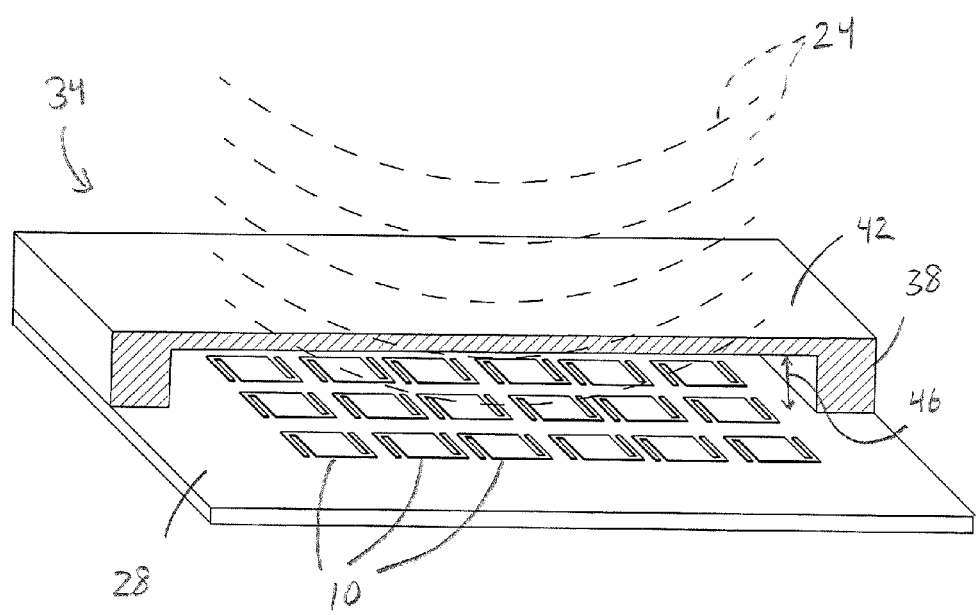
FIG. 3 is a perspective view of the bolometer device of FIG. 2 including a cap wafer formed on the substrate over the plurality of bolometer pixels.

FIG. 3 shows a typical prior art bolometer device 34 that include the substrate 28, the plurality of bolometer pixels 10, and a cap wafer 38. The cap wafer 38 extends from the substrate 28 and defines a cap layer 42 that is spaced apart from the bolometer pixels 10 by a distance 46. In one embodiment, the cap wafer 38 is formed from undoped or lowly doped silicon; however, the cap wafer may be formed from any desired material that is at least partially transparent to the IR 24.

The bolometer device 34 is shown in FIG. 3 as being exposed to infrared radiation 24 that is emitted by an object (not shown). The cap wafer 38 passes most of the IR 24 through to the pixels 10. Specifically, the material of the cap wafer 38 transmits about 60% to 70% of the IR 24 through the cap layer 42. When the IR 24 passes through the cap wafer 38 it is dispersed across the pixels 10 and the substrate 28. The percentage of the IR 24 that is incident on portions of the bolometer device 34 other than the bolometer pixels 10 is generally not used to determine the temperature of the object. This leads to an inherent inefficiency of the prior art bolometer device 34, since only a portion of the available IR 24 is used to heat the bolometer pixels 10.

Figure 4:
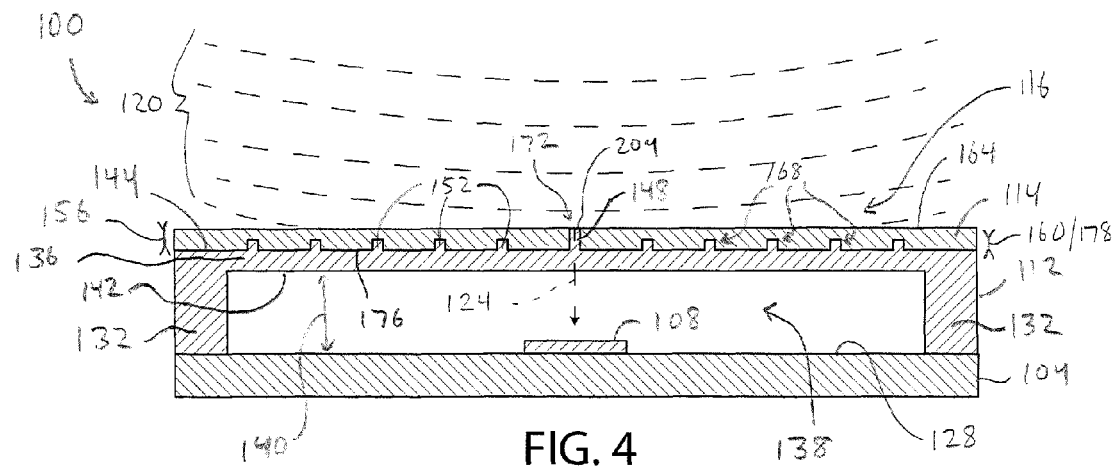
FIG. 4 is a side cross sectional view of a semiconductor sensor device, as described herein, taken along line IV-IV of FIG. 5, the semiconductor sensor device including a bolometer pixel and a lens structure defining a plurality of concentric grooves and an IR opening.

As shown in FIG. 4, a semiconductor device 100, as described herein, includes a substrate 104, a plurality of bolometer pixels 108 (only one of which is shown), a cap wafer 112, and a lens layer 114. Infrared radiation (IR) 120 is shown as being incident on the sensor device 100. The lens layer 114 includes a plurality of plasmonic lens structures 116 (only one of which is shown) that are configured to focus/beam the IR 120 into an IR ray 124 that is incident directly onto the pixel 108, thereby significantly increasing the efficiency of the semiconductor sensor device 100.

The substrate 104 is substantially planar and is also referred to herein as a "reflector" or a "reflector layer." The substrate 104 is typically formed from silicon using CMOS technology, but may be formed/made using any desired material and technology including silicon on insulator (SOI) technology.

The bolometer pixel 108, which is also referred to herein as an "absorber," is substantially identical to the bolometer pixel 10 of FIG. 1. In another embodiment, the bolometer pixel 108 is provided as any type of bolometer pixel as desired. The bolometer pixel 108 extends from an upper surface 128 of the substrate 104.

The cap wafer 112 is supported by the substrate 104 and includes a support structure 132 and a cap layer 136. The support structure 132 extends upward from the upper surface 128 of the substrate 104. The cap layer 136 extends from the support structure 136 and is spaced apart from the substrate 104 by a distance 140, such that a cavity 138 is defined between the upper surface 128 of the substrate and a lower surface 142 of the cap layer 136. The bolometer pixel 108 is located between the substrate 104 and the cap layer 136 and is at least partially located in the cavity 138. The cap layer 136 is substantially parallel to the substrate 104.

In one embodiment, the cap wafer 112 is formed from undoped or lowly doped silicon; however, the cap wafer may be formed from any desired material that is at least partially transparent to the IR 120. Furthermore, in some embodiments, the support structure 132 and the cap layer 136 are formed from different materials.

A post 148 and a plurality of ridges 152 are formed on an upper surface 144 of the cap layer 136. The post 148, which is also referred to herein as pillar, is a substantially cylindrical protuberance that extends upward (as shown in FIG. 4), away from the upper surface 144 of the cap layer 136 for a post distance 156. An exemplary post distance 156 is approximately 2.5 micrometers (2.5 µm). The post 148 defines a diameter of approximately 400 nanometers (400 nm). In another embodiment, the post 148 is any desired size and shape, such as square, rectangular, triangular, or any other desired shape including irregular shapes.

Figure 5:
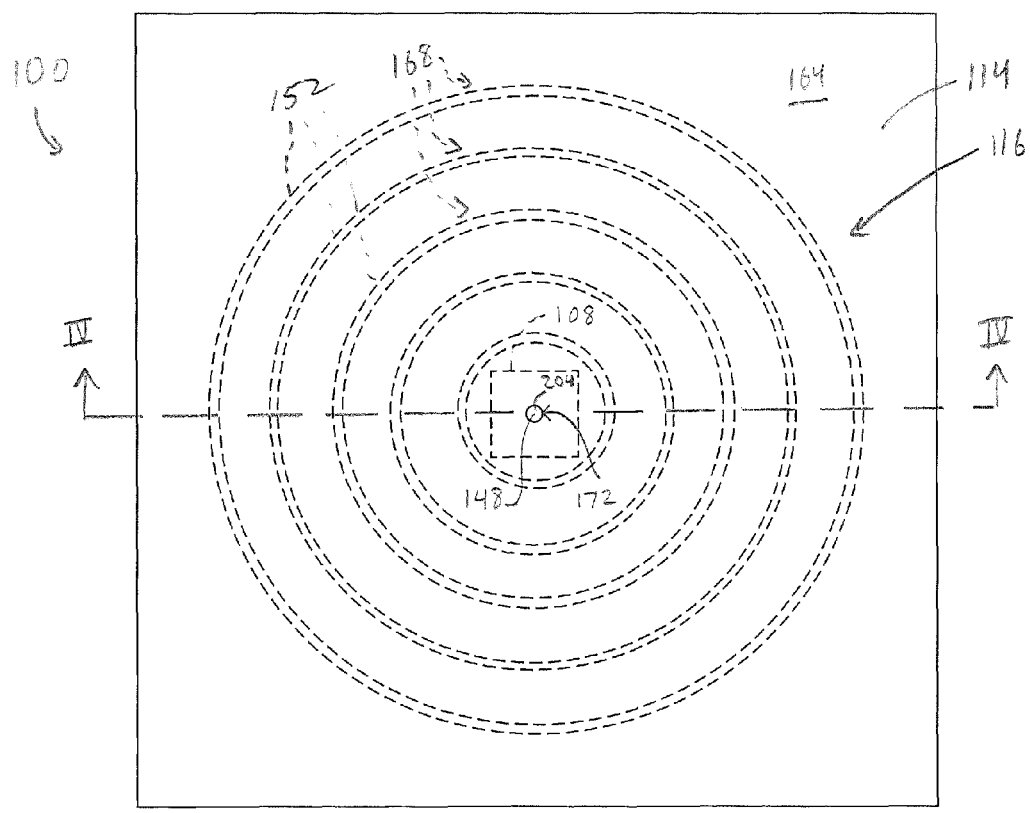
FIG. 5 is a top plan view of the semiconductor sensor device of FIG. 4, showing the plurality of concentric grooves and the bolometer pixel in broken lines.

With additional reference to FIG. 5, the ridges 152 are substantially circular and are concentrically arranged on the upper surface 144 of the cap layer 136. The ridges 152, as well as the bolometer pixel 108, are shown in phantom in FIG. 5 since they are located below the lens layer 114 as viewed from above. The cap layer 136 includes five of the ridges 156, but in other embodiments the cap layer includes any desired number of ridges. Each ridge 156 extends upward (as shown in FIG. 4), away from the upper surface 144 of the cap layer 136 for a ridge distance 160 that is less than the post distance 156. In one exemplary embodiment, the ridge distance 160 is approximately one micrometer (1 µm). As illustrated, the ridges 152 are approximately evenly spaced apart from each other, but may be unevenly spaced apart in another embodiment. Furthermore, the ridges 152 may have any desired shape and configuration including non-concentric configurations.

The lens layer 114 is supported by the cap layer 136 and, in particular, is located generally above the upper surface 144 of the cap layer. The lens layer 114 is referred to as being "generally above" the upper surface 144, since the post 148 may be considered part of the upper surface 144 and the post extends completely through the lens layer. With such an interpretation, the lens layer 114 is not "completely" above the upper surface 144, but is "generally above" the upper surface. In the illustrated embodiment, the lens layer 114 is formed on the upper surface 144 of the cap layer 136; however, in other embodiments, one or more other layers (not shown) may be positioned between the upper surface and the lens layer.

The lens layer 114 defines an upper surface 164 that is substantially planar and an opposite lower surface 176. The upper surface 164 is spaced apart from the lower surface 176 by approximately the post distance 156. Accordingly, a thickness of the lens layer 114 is approximately 2.5 micrometers (2.5 µm), in one embodiment.

The lens structure 116 of the lens layer 114 includes a plurality of grooves 168 and an IR opening 172. The grooves 168 are concentric circular grooves that are centered about the IR opening 172. The grooves 168 are defined in the lower surface 176 and are complementary in shape and size to the ridges 152 formed in/on the cap layer 136, such that the grooves are at least partially filled by the ridges (i.e. the material of the cap wafer 112). In one embodiment, the grooves 168 define a cross sectional area of approximately one square micrometer (1 µm) and are spaced apart from each other by approximately five micrometers (5 µm). The lens structure 116 includes the same number of grooves 168 as the number of ridges 152. Accordingly, the lens structure 116 includes five of the grooves 168 in the exemplary embodiment. The grooves 168 define a depth 178 that is less than the thickness of the lens layer 114.

With continued reference to FIG. 4, the IR opening 172, which is also referred to herein as an opening, a circular opening, an aperture opening, and an aperture, extends completely through the thickness of the lens layer 114, unlike the grooves 168. The IR opening 172 is positioned at approximately the center of each of the grooves 168, as shown in FIG. 5, and is located over the bolometer pixel 108. The IR opening 172 is complementary in shape and size to the post 148 and is substantially/completely filled with the post. The IR opening 172 and the post 148 are configured to be exposed to the IR 120. Depending on the configuration of the lens structure 116, the IR opening 172 may pass electromagnetic radiation outside of the infrared range.

The lens layer 114 may be formed from a "perfectly conducting material" (PCM) that is configured to prevent the passage of IR therethrough. The PCM has zero electrical resistance (i.e. is a perfect conductor) and is configured to block 100% of the IR 120 incident thereon. Accordingly, suitable materials for forming the lens layer 114 include metal, such as platinum, metallic alloys, and the like. Of course, the lens layer 114 may be formed from any suitable material.

Figure 6:
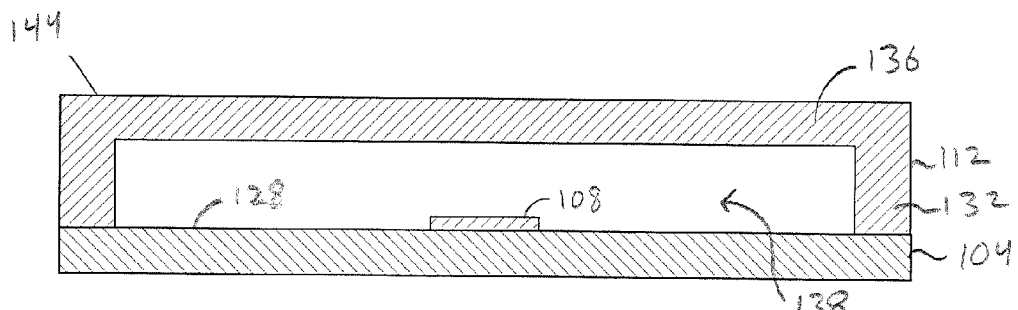
FIG. 6 is a side cross sectional view taken along a line similar to the line IV-IV of FIG. 5, showing a substrate, a bolometer pixel, and a cap wafer.

As shown in FIG. 6, a method of fabricating the semiconductor device 100 includes providing the substrate 104. Next, the bolometer pixel 108 is formed on the upper surface 128 of the substrate 104 according to any desired process. After formation of the bolometer pixel 108, the cap wafer 112 is applied/formed on the substrate 104 using any process.

Figure 7:
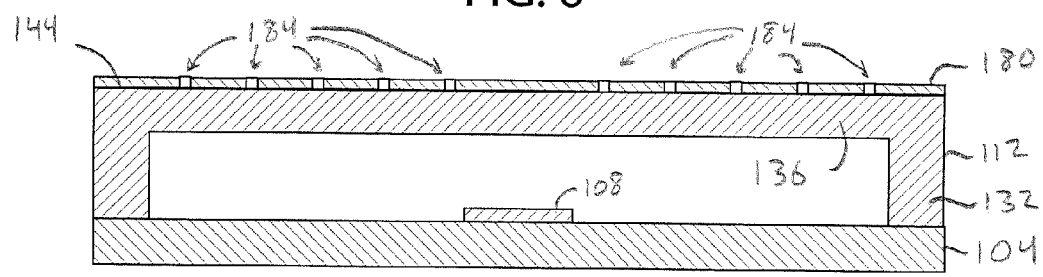
FIG. 7 is a side cross sectional view taken along a line similar to the line IV-IV of FIG. 5, showing a plurality of concentric grooves formed in a first portion of a sacrificial layer applied to the cap wafer.

Next, with reference to FIG. 7, a first portion of a sacrificial layer 180 is deposited on the upper surface 144 of the cap layer 136. The sacrificial layer 180 defines a thickness approximately equal to the ridge distance 160 (FIG. 4). The sacrificial layer 180 is formed from any desired material.

The method further includes applying/depositing/forming/printing a mask (not shown) on the sacrificial layer 180. The mask is a resist mask, a photo mask, or the like. The mask is applied in a pattern that corresponds to the desired configuration of the ridges 152, but does not typically account for the post 148 (in this exemplary embodiment). The sacrificial layer 180 is trenched through the mask to form a plurality of concentric grooves 184. The grooves 184 are complementary in size and shape to the ridges 152.

Figure 8:
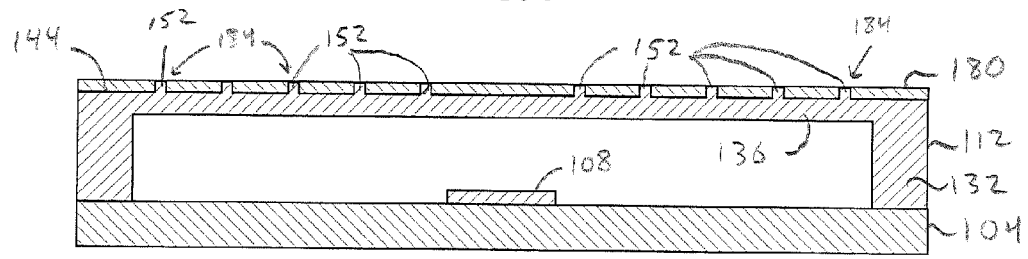
FIG. 8 is a side cross sectional view taken along a line similar to the line IV-IV of FIG. 5, showing material of the cap wafer deposited into the concentric grooves formed in the first portion of the sacrificial layer.

As shown in FIG. 8, next the material of the cap wafer 112 is deposited into the grooves 184 to form the ridges 152. After the depositing, the ridges 152 and the sacrificial layer 180 may be polished using chemical and mechanical polishing (CMP) or any other desired smoothing/polishing process.

Figure 9:
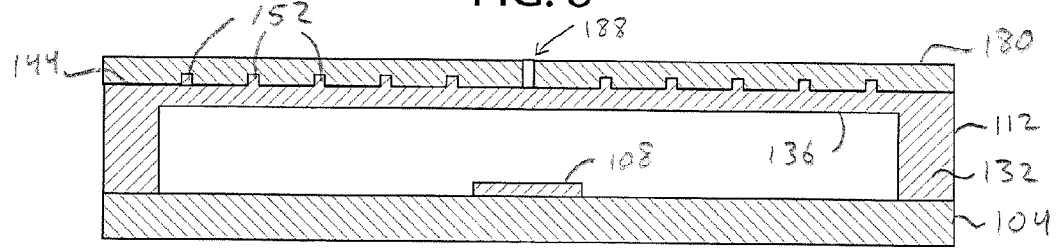
FIG. 9 is a side cross sectional view taken along a line similar to the line IV-IV of FIG. 5, showing a second portion of the sacrificial layer including a post opening formed completely through the sacrificial layer.

With reference to FIG. 9, a second portion of the sacrificial layer 180 is formed over the ridges 152. Then, another mask (not shown) is applied to the sacrificial layer 180 in a pattern that corresponds to the desired configuration of the post 148. Afterwards, the sacrificial layer 180 is trenched to form a post opening 188 that extends through the sacrificial layer.

Figure 10:
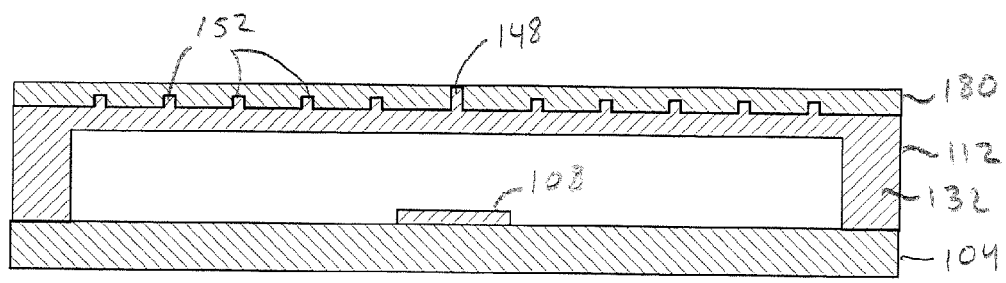
FIG. 10 is a side cross sectional view taken along a line similar to the line IV-IV of FIG. 5, showing material of the cap wafer deposited into the post opening.
Figure 11:
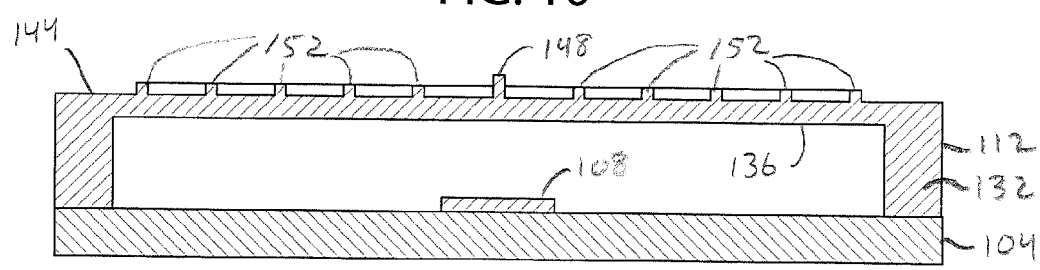
FIG. 11 is a side cross sectional view taken along a line similar to the line IV-IV of FIG. 5, showing a plurality of concentric ridges and a center post after removal of the sacrificial layer.

In FIG. 10, material of the cap wafer 112 is deposited into the post opening 188 to form the post 148. Next, as shown in FIG. 11, the sacrificial layer 180 is etched away, using any desired process. Removal of the sacrificial layer 180 exposes the post 148, the ridges 152, and the upper surface 144 of the cap layer 136.

Figure 12:
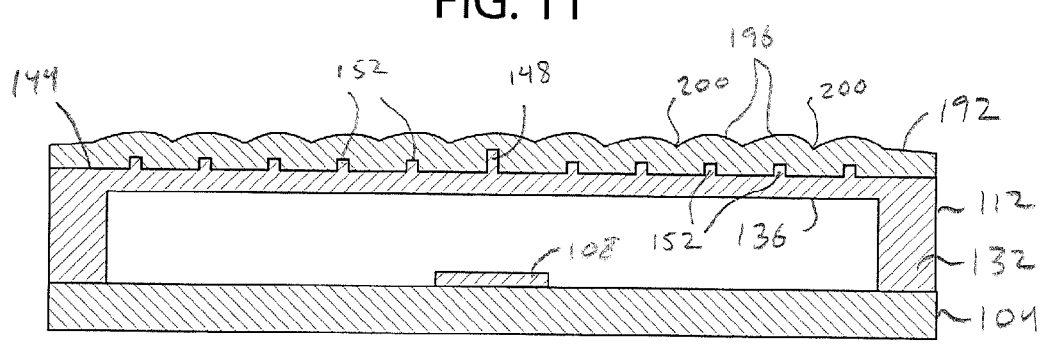
FIG. 12 is a side cross sectional view taken along a line similar to the line IV-IV of FIG. 5, showing material of the lens structure deposited over the plurality of concentric ridges and the center post.

According to FIG. 12, a conformal layer 192 of the material of the lens layer 114 (FIG. 4) is deposited onto the upper surface 144 of the cap layer 136, the post 148, and the ridges 152. In the illustrated embodiment, the conformal layer 192 is formed using a predetermined number of cycles of atomic layer deposition (ALD). The conformal layer 192 includes a plurality of curved surfaces 196 and valleys 200. The valleys 200 correspond approximately to a midpoint between the ridges 152. An apex of the curved surfaces 196 corresponds to the location of the ridges 152. The valleys 200 and the curved surfaces 196 are a consequence of the layered formation of the conformal layer 192. In another embodiment the material of the lens structure 116 is deposited using any desired process including sputtering and evaporative techniques.

Next, with reference again to FIG. 4, the conformal layer 192 is smoothed using CMP or another desired process to arrive at the smooth and flat upper surface 164 of the lens structure 116. The polishing step removes a portion of the conformal layer 192 that is in contact with a post upper surface 204, thereby uncapping the IR opening 172. After polishing, the ridges 152, however, remain buried below the upper surface 164 of the lens layer 114 and are not directly exposed to the IR 120.

In operation, the lens structure 116 of the semiconductor device 100 focuses and/or to beams the IR 120 into an IR ray 124 that is directed onto an absorber (see absorber 14, FIG. 1) of the bolometer pixel 108. With continued reference to FIG. 4, when the lens layer 114 is exposed to the IR 120, the lens structure 116 enables the IR to pass through the IR opening 172, but blocks the passage of the IR through all other areas of the lens layer 114. As a result of the size and shape of the grooves 168 (among other factors), the IR 120 that passes through the IR opening 172 is emitted as the focused ray of IR 124. The IR ray 124 passes through the cap layer 136 and is incident on the pixel 108. Accordingly, the lens structure 116 functions as a plasmonic lens that is configured to focus the IR 120 onto the pixel 108 instead of allowing the IR to be scattered across the substrate 104 as in the prior art bolometer device 34 of FIG. 3. Additionally, the lens structure 116 results in more efficient absorption of the IR 120 by the pixel 108 and a higher responsively from the sensor device 100.

The lens structure 116 is configurable to pass a particular wavelength of electromagnetic radiation therethrough, typically in the infrared range. In particular, the wavelength of electromagnetic radiation that passes through the IR opening 172 is dependent on the shape of the opening 172, the diameter of the opening 172, the number of the grooves 168, and the size of the grooves 168 (width and depth), among other factors. In general, the efficiency of the lens structure 116 increases as the wavelength of the IR 120 nears the target wavelength. In this way, the lens structure 116 is configurable to be sensitive to a particular wavelength or a range of wavelengths, instead of being sensitive to all wavelengths of electromagnetic radiation in general. In one embodiment, the semiconductor device 100 includes a lens layer 114 having a plurality of differently configured lens structures 116 to enable the semiconductor device to be sensitive to more than one desired wavelength or more than one range of wavelengths.

Figure 13:
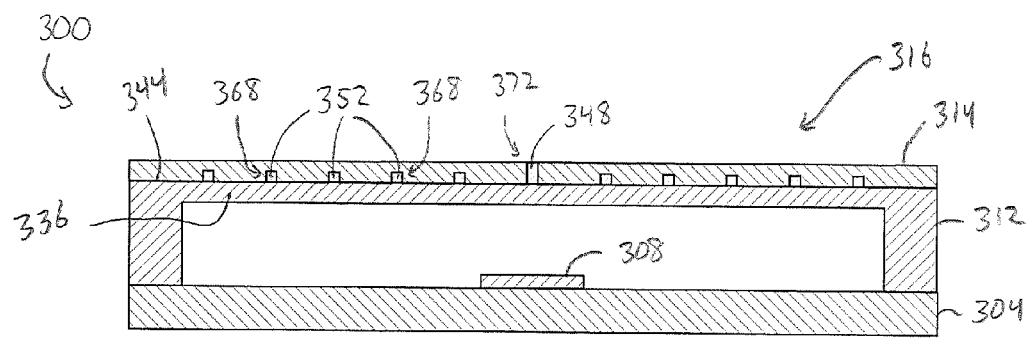
FIG. 13 is a side cross sectional view of another embodiment of a semiconductor sensor device, as described herein, taken along line XIII-XIII of FIG. 14, the semiconductor sensor device including a bolometer pixel and a lens structure defining a plurality of concentric grooves and an IR opening.
Figure 14:
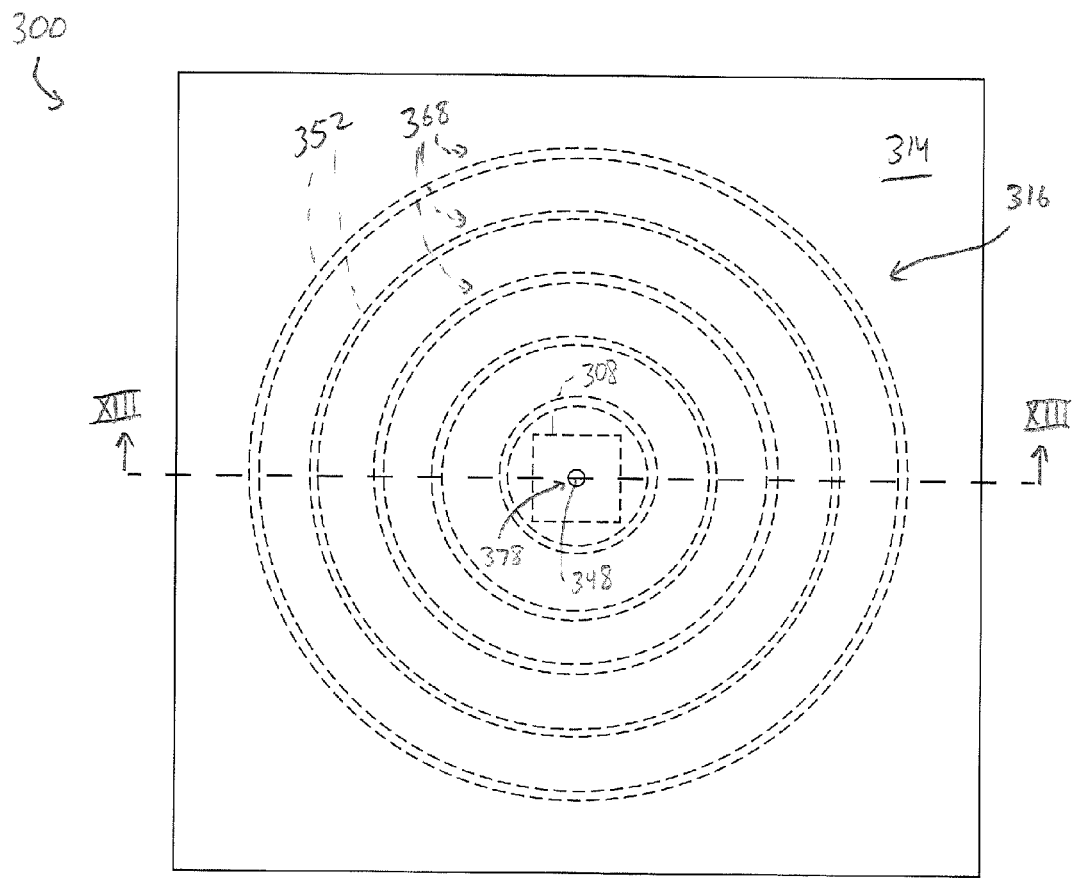
FIG. 14 is a top plan view of the semiconductor sensor device of FIG. 13, showing the plurality of concentric grooves and the bolometer pixel in broken lines.

As shown in FIGS. 13 and 14, another embodiment of a semiconductor device 300 includes a substrate 304, a plurality of bolometer pixels 308 (only one of which is shown), a cap wafer 312, and a plurality of lens structures 316 (only one of which is shown) formed in a lens layer 314. A post 348 and a plurality of ridges 352 and are formed on an upper surface 344 of a cap layer 336 of the cap wafer 312. The lens structure 316 defines an aperture 372 in which the post 348 is located, and a plurality of grooves 368 that is substantially/completely filled with the ridges 352.

The semiconductor device 300 is substantially identical to the semiconductor device 100, except that the post 348 and the ridges 352 are formed from a material that is different than the material of the cap wafer 312. The material of the post 348 and the ridges 352 is deposited into trenches formed in a sacrificial layer (See e.g. grooves 184 formed in the sacrificial layer 180 of FIG. 8) using any commonly used deposition technique including evaporation, sputtering, and ALD among others.

The post 348 and the ridges 352 may be formed from a material having a refractive index that is close to the refractive index of air. The wavelength of the electromagnetic radiation (typically IR) that the lens structure 316 is configured to efficiently focus through the aperture 372 is based on the material from which the post 348 and the ridges 352 is formed. Accordingly, by selecting a material with a particular index of refraction the lens structure 316 is "tuned" to a desired wavelength of electromagnetic radiation.

Figure 15:
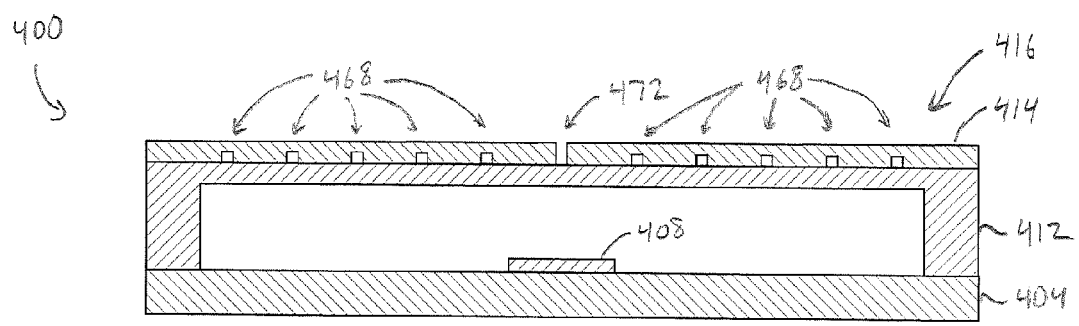
FIG. 15 is a side cross sectional view of another embodiment of a semiconductor sensor device, as described herein, taken along line XV-XV of FIG. 16, the semiconductor sensor device including a bolometer pixel and a lens structure defining a plurality of concentric grooves and an IR opening.
Figure 16:
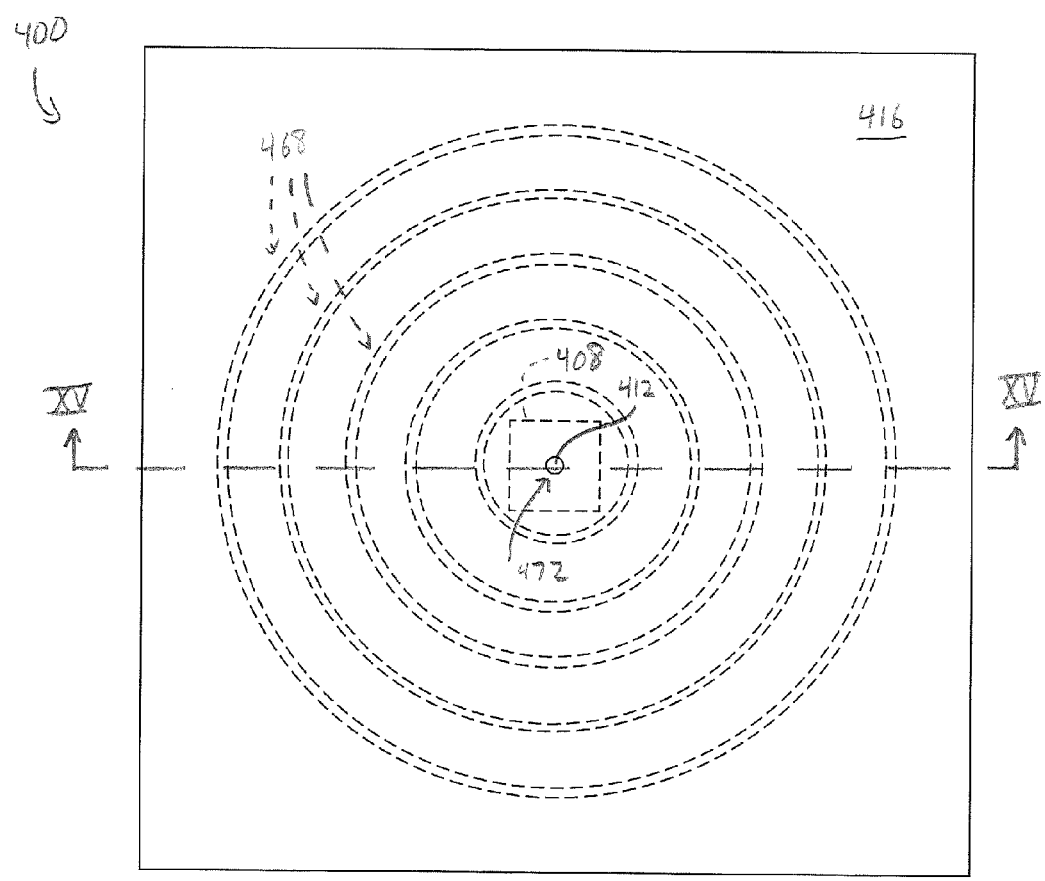
FIG. 16 is a top plan view of the semiconductor sensor device of FIG. 15, showing the plurality of concentric grooves and the bolometer pixel in broken lines.

As shown in FIGS. 15 and 16, another embodiment of a semiconductor device 400 includes a substrate 404, a plurality of bolometer pixels 408 (only one of which is shown), a cap wafer 412, and a plurality of lens structures 416 (only one of which is shown). The lens structure 416 defines an aperture 472 and a plurality of grooves 468.

The semiconductor device 400 is substantially identical to the semiconductor device 100, except that the semiconductor device 400 does not include a post 148 or the ridges 152. Instead, the grooves 468 and the aperture 472 are gas-filled/air-filled voids. The type of gas(es) in the gas-filled 468, 472 voids is selectable to have a desired index of refraction to enable "tuning" of the lens structure 416.

In one embodiment, the grooves 468 and the aperture 472 of the semiconductor device 400 are formed similarly to the grooves 168 and the IR opening 172 of the semiconductor device 100. Instead of forming the post 148 and the ridges 152 from the material of cap wafer 112, however, the post 148 and the ridges 152 are formed form a thermally decomposable sacrificial polymer such as "Unity" or a photo-definable material. The thermally decomposable material of the post 148 and the ridges 152 is deposited using any commonly used deposition technique including evaporation, sputtering, and atomic layer deposition among others. A thermally decomposable sacrificial polymer is a material that is selectively removable from the sensor device 100 in response to being heated to a predetermined temperature. The semiconductor device 400 is heated to approximately 300 to 400 degrees Celsius, for example, in order to evaporate/decompose the thermally decomposable sacrificial polymer. Upon being heated, the thermally decomposable sacrificial polymer evaporates through the material of the lens structure 416 and/or through the material of the cap wafer 412. Evaporation of the material of the post 148 and the ridges 152 leaves behind the air-filled grooves 468 and the aperture 472.

Figure 17:
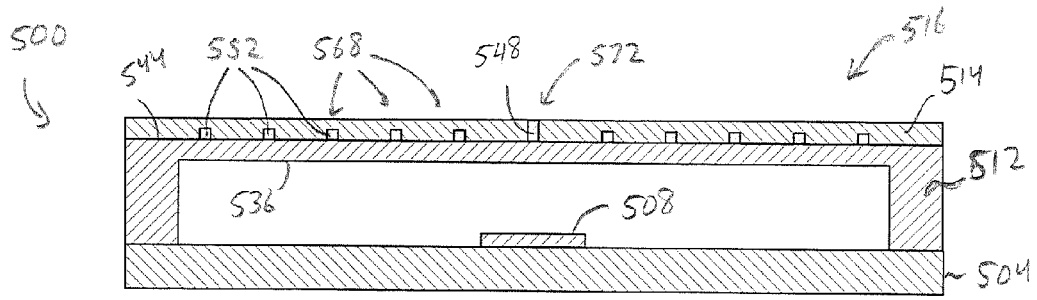
FIG. 17 is a side cross sectional view of another embodiment of a semiconductor sensor device, as described herein, taken along line XVII-XVII of FIG. 18, the semiconductor sensor device including a plurality of bolometer pixels and a lens structure defining a plurality of linear grooves and an IR opening.
Figure 18:
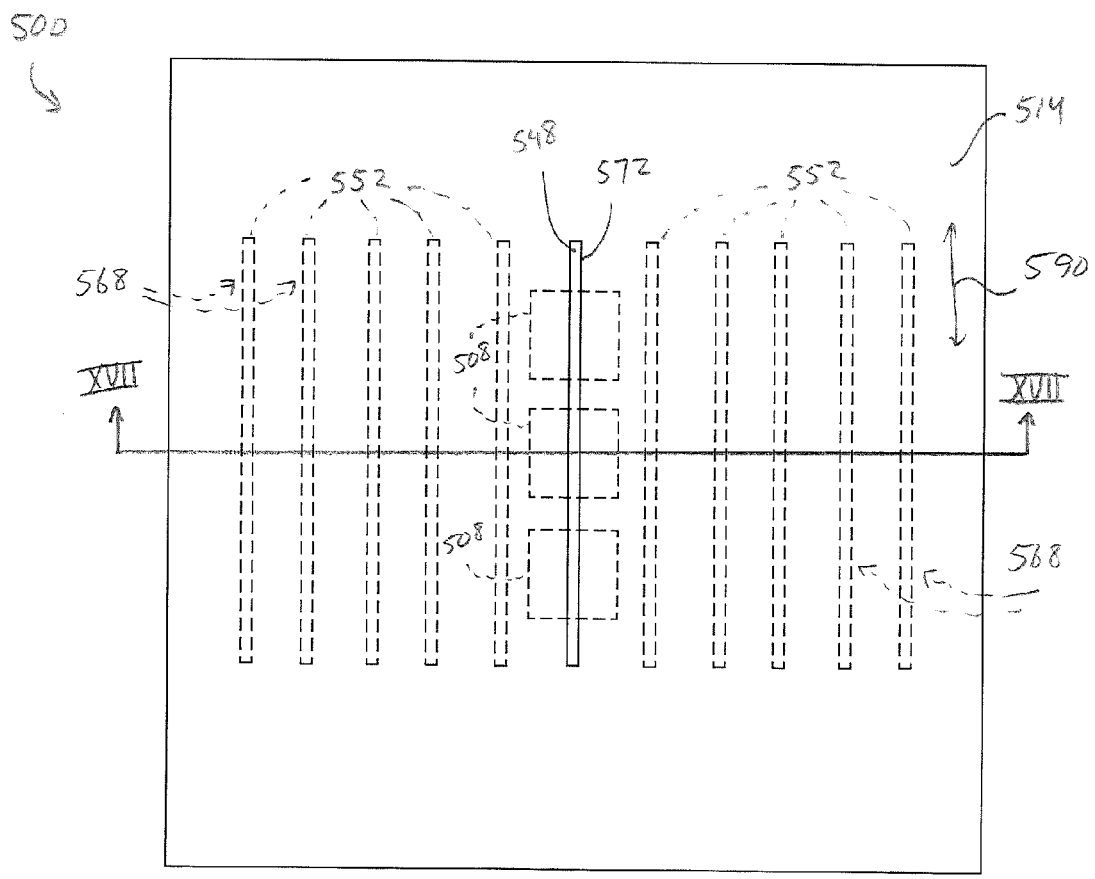
FIG. 18 is a top plan view of the semiconductor sensor device of FIG. 17, showing the plurality of linear grooves and the plurality of bolometer pixels in broken lines.

As shown in FIGS. 17 and 18, another embodiment of a semiconductor device 500 includes a substrate 504, a plurality of bolometer pixels 508 (only three of which are shown), a cap wafer 512, and lens layer 514 includes a plurality of lens structures 516 (only one of which is shown). An aperture ridge 548 and a plurality of ridges 552 and are formed on an upper surface 544 of a cap layer 536 of the cap wafer 512. The lens structure defines a slit 572 (also referred to herein as an opening, an aperture opening, and an aperture) in which the aperture ridge 548 is located, and a plurality of grooves 568 that is substantially/completely filled with the ridges 552.

The semiconductor device 500 is substantially identical to the semiconductor device 100, except that the grooves 568 and the aperture 572 are substantially linear and extend in a slit direction 590 instead of being circular. The lens structure 516 functions substantially similarly as the lens structure 116 to focus/beam the IR (see IR 120 of FIG. 4) onto the bolometer pixels 508.

Figure 19:
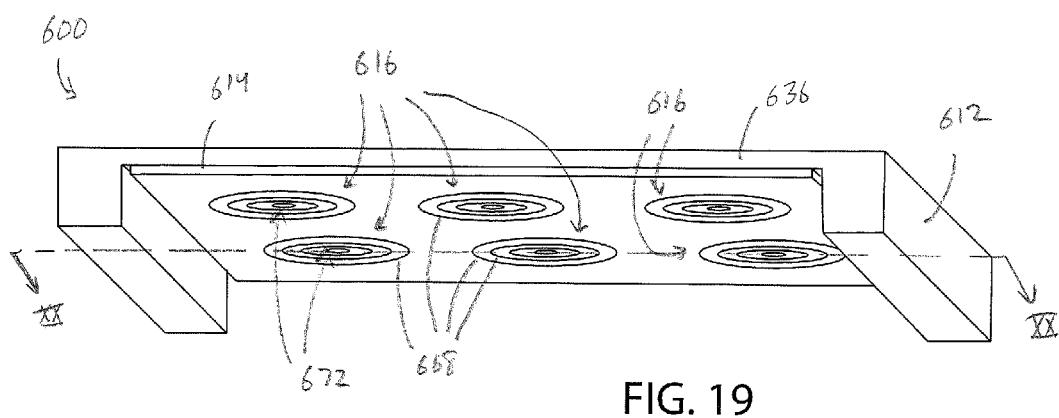
FIG. 19 is a perspective view of an embodiment of a semiconductor sensor device, as described herein, that includes a lens layer formed on an underside of a cap wafer, the lens layer is shown as defining six lens structures.
Figure 20:
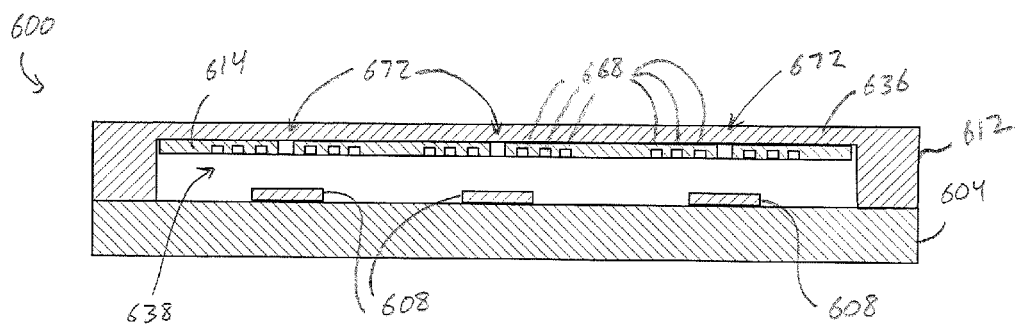
FIG. 20 is a side cross sectional view taken along the line XX-XX of FIG. 19.

As shown in FIGS. 19 and 20, another embodiment of a semiconductor device 600 includes a substrate 604, a plurality of bolometer pixels 608 (only three of which are shown), a cap wafer 612, and a lens layer 614 defining a plurality of lens structures 616 (only six of which are shown). Each of the lens structures 616 defines an aperture 672 and a plurality of grooves 668.

The semiconductor device 600 is substantially identical to the semiconductor device 400, except that the lens layer 614 (and the lens structures 616 formed thereon) is located in a cavity 638 defined between the substrate 604 and a cap layer 636 of the cap wafer 612. Since the lens structures 616 are positioned on an "underside" of the cap layer 636 the IR (see IR 120 of FIG. 4) passes through the cap layer before being focused by the lens structures 616.

Figure 21:
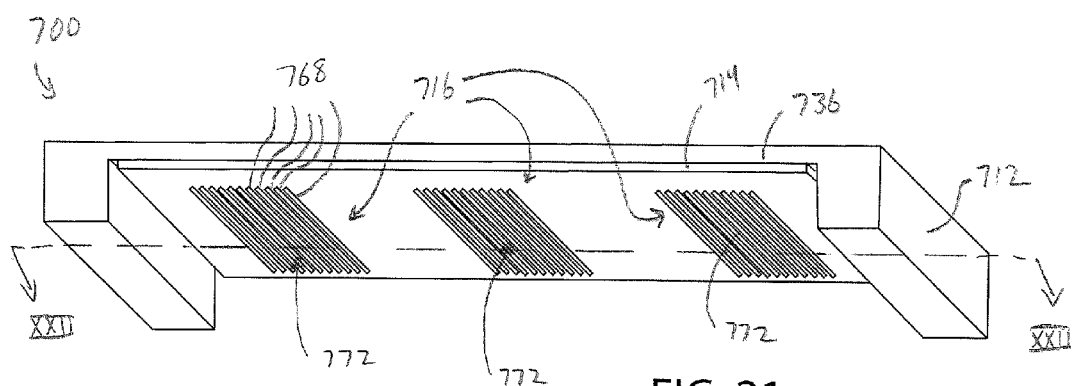
FIG. 21 is a perspective view of an embodiment of a semiconductor sensor device, as described herein, that includes a lens layer formed on an underside of a cap wafer, the lens layer is shown as defining three lens structures.
Figure 22:
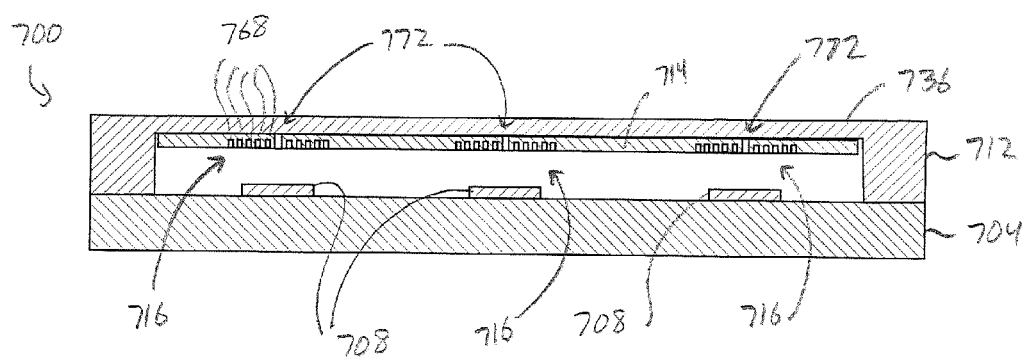
FIG. 22 is a side cross sectional view taken along the line XXII-XXII of FIG. 21.

As shown in FIGS. 21 and 22, another embodiment of a semiconductor device 700 includes a substrate 704, a plurality of bolometer pixels 708 (only three of which are shown), a cap wafer 712, and a lens layer 714 defining a plurality of lens structures 716 (only three of which are shown). Each of the lens structures 716 defines a slit-shaped aperture 772 and a plurality of substantially linear grooves 768.

The semiconductor device 700 is substantially identical to the semiconductor device 500, except that the lens structures 716 are located between the substrate 704 and a cap layer 736 of the cap wafer 712. Since the lens structures 716 are positioned on an "underside" of the cap layer 736 the IR (see IR 120 of FIG. 4) passes through the cap layer before being focused by the lens structures 716.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A semiconductor device, comprising:
a substrate having an upper surface;
a cap wafer including a support structure supported by the substrate and a cap layer extending from the support structure and spaced vertically apart from the substrate, the cap layer including a lower surface and an opposite upper surface;
an absorber extending from the upper surface of the substrate and located between the substrate and the cap layer; and
a lens layer supported by the cap layer, the lens layer including a plurality of grooves and an opening located over the absorber and vertically spaced apart from the absorber by a cavity, the cavity is defined between the upper surface of the substrate and the lower surface of the cap layer,
wherein the lens layer is located generally above the opposite upper surface of the cap layer, and
wherein a portion of the cap layer extends within the opening.

2. The semiconductor device of claim 1, wherein a lower surface of the lens layer includes the plurality of grooves.

3. The semiconductor device of claim 2, wherein:
the cap wafer is formed from a material, and
the plurality of grooves is at least partially filled with the material of the cap wafer.

4. The semiconductor device of claim 2, wherein:
the lens layer has a thickness,
the plurality of grooves has a depth that is less than the thickness of the lens layer, and
the opening extends through the thickness of the lens layer.

5. The semiconductor device of claim 1, wherein:
the opening is a circular opening, and
the plurality of grooves includes a plurality of concentric circular grooves centered about the circular opening.

6. The semiconductor device of claim 1, wherein:
the opening is a slit extending in a slit direction, and
the grooves of the plurality of grooves are substantially linear and extend in the slit direction.

7. The semiconductor device of claim 1, wherein:
the lens layer is formed from a first material configured to block a passage of infrared radiation therethrough, and
the cap wafer is formed from a second material configured to transmit infrared radiation therethrough.

8. The semiconductor device of claim 7, wherein:
the first material is metal, and
the second material is silicon.

9. A method of fabricating a semiconductor device, comprising:
forming an absorber on an upper surface of a substrate;
supporting a cap layer over the substrate to define a cavity between the substrate and the cap layer in which the absorber is located, the cap layer including a lower surface and an opposite upper surface, and the cavity defined between the upper surface of the substrate and the lower surface of the cap layer; and
forming a lens layer on the cap layer, the lens layer being spaced apart from the cavity and including a plurality of grooves and an opening, and the lens layer located generally above the opposite upper surface of the cap layer, the opening located over the absorber and vertically spaced apart from the absorber by the cavity, a portion of the cap layer extending within the opening.

10. The method of claim 9, further comprising:
forming a post on an upper surface of the cap layer;
forming a plurality of ridges on the upper surface of the cap layer; and
forming the lens layer over the plurality of ridges and the post,
wherein the plurality of ridges define the plurality of grooves.

11. The method of claim 10, further comprising:
forming the opening by chemically and mechanically polishing the lens layer to expose the post.

12. The method of claim 10, further comprising:
removing the plurality of ridges after forming the lens layer.

13. The method of claim 12, wherein the removing the plurality of ridges includes evaporating the plurality of ridges.

14. The method of claim 12, wherein the plurality of ridges is formed from a thermally decomposable sacrificial polymer.

15. The method of claim 9, wherein:
the opening is a circular opening, and
the plurality of grooves includes a plurality of concentric circular grooves centered about the circular opening.

16. The method of claim 9, wherein:
    the opening is a rectangular slit extending in a slit direction, and
    the grooves of the plurality of grooves are substantially linear and extend in the slit direction.

17. The semiconductor device of claim 9, further comprising:
    blocking a passage of infrared radiation with a material of the lens layer; and
    transmitting infrared radiation through a material of the cap layer.

* * * * *